(12) United States Patent
Chowdhury et al.

(10) Patent No.: US 11,581,213 B2
(45) Date of Patent: Feb. 14, 2023

(54) SUSCEPTOR WAFER CHUCKS FOR BOWED WAFERS

(71) Applicant: Applied Materials, Inc., Santa Clara, CA (US)

(72) Inventors: Abhishek Chowdhury, Bangalore (IN); Vijayabhaskara Venkatagiriyappa, Bangalore (IN); Mihaela A. Balseanu, Sunnyvale, CA (US); Jyoti Prakash Deo, Bangalore (IN); Srinivas Ramakrishna, Bangalore (IN); Keiichi Tanaka, San Jose, CA (US); Mandyam Sriram, San Jose, CA (US); Francis Kanyiri Mungai, San Jose, CA (US); Mario D. Silvetti, Morgan Hill, CA (US); Sriharish Srinivasan, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 198 days.

(21) Appl. No.: 17/029,648

(22) Filed: Sep. 23, 2020

(65) Prior Publication Data

US 2022/0093443 A1 Mar. 24, 2022

(51) Int. Cl.
| | |
|---|---|
| *H01L 21/683* | (2006.01) |
| *H01L 21/687* | (2006.01) |
| *C23C 16/458* | (2006.01) |

(52) U.S. Cl.
CPC ........ *H01L 21/6838* (2013.01); *C23C 16/458* (2013.01); *H01L 21/68714* (2013.01)

(58) Field of Classification Search
None
See application file for complete search history.

(56) References Cited

U.S. PATENT DOCUMENTS

| | | | |
|---|---|---|---|
| 4,403,567 A * | 9/1983 | daCosta | H01L 21/6838 118/724 |
| 5,580,388 A | 12/1996 | Moore et al. | |
| 5,820,686 A | 10/1998 | Moore | |
| 6,853,533 B2 * | 2/2005 | Parkhe | H01L 21/67109 361/234 |
| 9,612,215 B2 * | 4/2017 | Fujita | C30B 25/12 |
| 9,761,473 B2 | 9/2017 | Kim et al. | |
| 2007/0160507 A1 | 7/2007 | Satoh et al. | |
| 2008/0194169 A1 | 8/2008 | Sterling et al. | |

(Continued)

FOREIGN PATENT DOCUMENTS

| | | |
|---|---|---|
| KR | 20140067790 A | 6/2014 |
| TW | 201120986 A | 6/2011 |
| WO | 2014126849 A1 | 8/2014 |

*Primary Examiner* — Sylvia Macarthur
(74) *Attorney, Agent, or Firm* — Servilla Whitney LLC

(57) ABSTRACT

Apparatus and methods for vacuum chucking a substrate to a susceptor. The susceptor comprises one or more angularly spaced pockets are positioned around a center axis of the susceptor, the one or more angularly spaced pockets having an inner pocket and an outer pocket. The susceptor can be configured as an intermediate chuck having one or more pucks positioned within the inner pocket or as a distributed chuck having one or more pucks positioned within the outer pocket. The one or more pucks has a center hole, at least one radial channel and at least one circular channel having chuck holes for vacuum chucking a substrate.

20 Claims, 10 Drawing Sheets

(56) References Cited

U.S. PATENT DOCUMENTS

2009/0283036 A1    11/2009  Duong et al.
2017/0352575 A1*  12/2017  Gangakhedkar .... H01L 21/6838
2020/0357679 A1*  11/2020  Parkhe ................... H01L 21/67
2022/0093443 A1*   3/2022  Chowdhury .......... C23C 16/458

* cited by examiner

SUSCEPTOR WAFER CHUCKS FOR BOWED WAFERS

TECHNICAL FIELD

The present disclosure relates generally to susceptor wafer chucks for semiconductor processing. In particular, embodiments of the disclosure are directed to vacuum chucks to secure highly-bowed wafers.

BACKGROUND

Wafer (or substrate) chucking is important during semiconductor manufacturing. Conventional substrate supports use center vacuum chucking to hold a wafer on a susceptor. Bowed wafers may not fully chuck on a conventional center-chucking susceptor. The degree of bowing and the direction of bowing may also affect the chucking force.

In some spatially arranged processing chambers, wafers may be subjected to rapid and frequent movement. The wafers are repeatedly subjected to high acceleration and deceleration forces as substrate supports are rotated. When a wafer is bowed, the chucking force is decreased and wafers can become de-chucked during movements causing damage to the process chamber and loss of yield. Additionally, the process chamber may be subjected to extended periods of down-time to repair broken components and remove de-chucked wafers.

Accordingly, there is a need in the art for apparatus and methods to improve chucking of highly bowed wafers.

SUMMARY

One or more embodiments of the disclosure are directed to susceptor assemblies comprising a susceptor, one or more angularly spaced pockets and one or more pucks. The susceptor has a top surface, a bottom surface and a center axis. The top surface and bottom surface define a thickness of the susceptor. The one or more angularly spaced pockets are formed in the top surface of the susceptor. Each of the angularly spaced pockets has an inner pocket and an outer pocket. The inner pocket has an inner pocket top surface at an inner pocket depth from the top surface of the susceptor. The outer pocket has an outer pocket top surface at an outer pocket depth from the top surface of the susceptor. The inner pocket depth is greater than the outer pocket depth. The one or more pucks have a body with an outer peripheral edge, a top surface and a bottom surface defining a thickness. Each of the pucks is positioned within one of the pockets. The bottom surface of one or more of the pucks has a center hole extending a distance into the body with at least one radial channel extending from the center hole to the outer peripheral edge of the body. Each of the at least one radial channel has a plurality of radial chuck holes extending from a bottom surface of the channel through the thickness of the body to the top surface of the body.

Additional embodiments of the disclosure are directed to processing chambers comprising a vacuum chamber and a susceptor assembly. The vacuum chamber has a bottom with an opening therethrough. The susceptor assembly comprises a susceptor, one or more angularly spaced pockets and one or more pucks. The susceptor has a top surface, a bottom surface and a center axis. The top surface and bottom surface define a thickness of the susceptor. The one or more angularly spaced pockets are formed in the top surface of the susceptor. Each of the angularly spaced pockets has an inner pocket and an outer pocket. The inner pocket has an inner pocket top surface at an inner pocket depth from the top surface of the susceptor. The outer pocket has an outer pocket top surface at an outer pocket depth from the top surface of the susceptor. The inner pocket depth is greater than the outer pocket depth. The one or more pucks have a body with an outer peripheral edge, a top surface and a bottom surface defining a thickness. Each of the pucks is positioned within one of the pockets. The bottom surface of one or more of the pucks has a center hole extending a distance into the body with at least one radial channel extending from the center hole to the outer peripheral edge of the body. Each of the at least one radial channel has a plurality of radial chuck holes extending from a bottom surface of the channel through the thickness of the body to the top surface of the body.

Additional embodiments of the disclosure are directed to methods for vacuum chucking a substrate onto a susceptor assembly. One or more substrates are positioned over one or more radially spaced pockets of a susceptor. A vacuum is created through one or more of a center chuck hole or a radial chuck hole extending through a thickness of the one or more pucks. The susceptor has a top surface, a bottom surface and a center axis. The top surface and bottom surface define a thickness of the susceptor. The one or more angularly spaced pockets are formed in the top surface of the susceptor. Each of the angularly spaced pockets has an inner pocket and an outer pocket. The inner pocket has an inner pocket top surface at an inner pocket depth from the top surface of the susceptor. The outer pocket has an outer pocket top surface at an outer pocket depth from the top surface of the susceptor. The inner pocket depth is greater than the outer pocket depth. The one or more pucks have a body with an outer peripheral edge, a top surface and a bottom surface defining a thickness. Each of the pucks is positioned within one of the pockets. The bottom surface of one or more of the pucks has a center hole extending a distance into the body with at least one radial channel extending from the center hole to the outer peripheral edge of the body. Each of the at least one radial channel has a plurality of radial chuck holes extending from a bottom surface of the channel through the thickness of the body to the top surface of the body.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface.

One or more embodiments of the disclosure advantageously provide apparatus to chuck bowed wafers. A conventional wafer chucking apparatus can chuck wafers with up to 100 microns of bowing. Some embodiments of the disclosure advantageously provide apparatus that can reliably vacuum chuck wafers with a bow of up to 1000 microns. Some embodiments enable the use of larger susceptor hole diameters without affecting the thermal profile of the wafer. Some embodiments advantageously increase chucking force by avoiding pressure losses.

Figure 1:
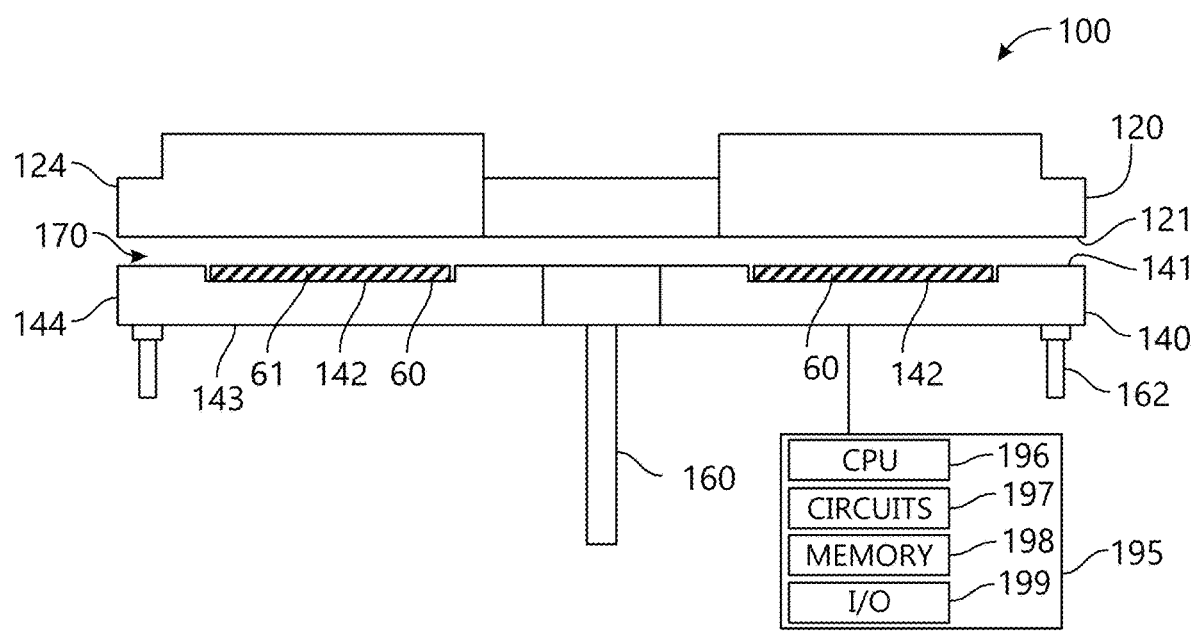
FIG. 1 shows a cross-sectional view of a batch processing chamber in accordance with one or more embodiment of the disclosure.

Some embodiments of the disclosure are directed to film deposition processes using a batch processing chamber, also referred to as a spatial processing chamber. FIG. 1 shows a cross-section of a processing chamber 100 including a gas distribution assembly 120, also referred to as gas injectors or an injector assembly, and a susceptor 140. The gas distribution assembly 120 is any type of gas delivery device used in a processing chamber. The gas distribution assembly 120 includes a front surface 121 which faces the susceptor 140. The front surface 121 can have any number or variety of openings to deliver one or more flow of gases toward the susceptor 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. In a binary reaction, the plurality of gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the substrate. Some of the gas flow moves horizontally across the surface of the substrate and out of the processing region through the purge gas P channel(s).

Figure 2:
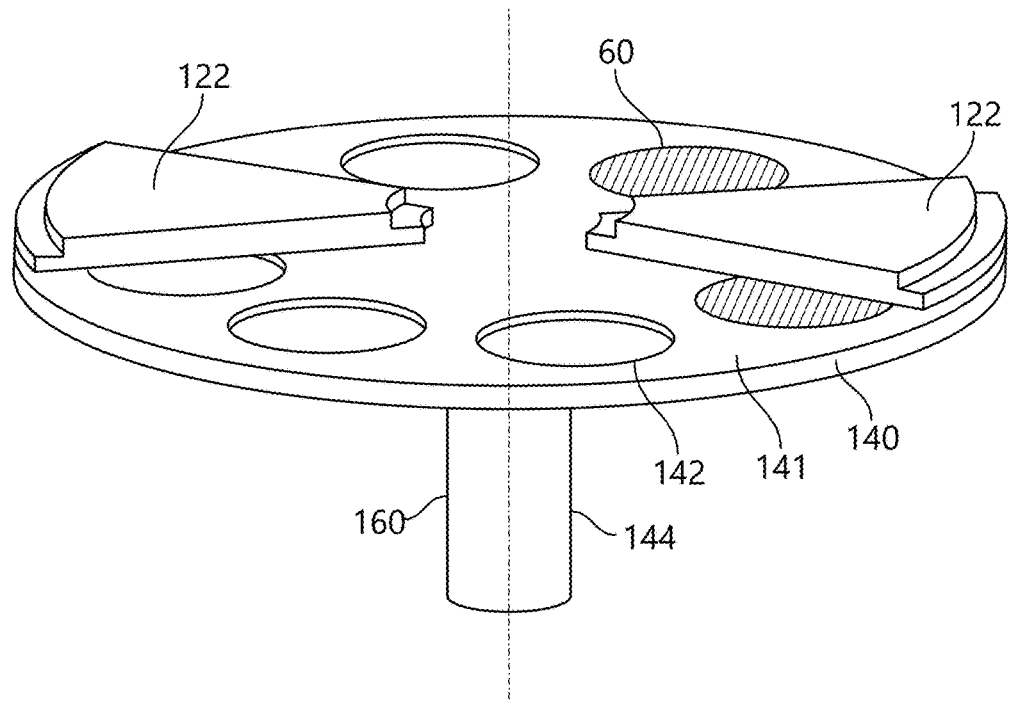
FIG. 2 shows a partial perspective view of a batch processing chamber in accordance with one or more embodiment of the disclosure.

In some embodiments, the gas distribution assembly 120 is a rigid stationary body made of a single injector unit. For example, a single wafer processing chamber showerhead. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

Figure 4:
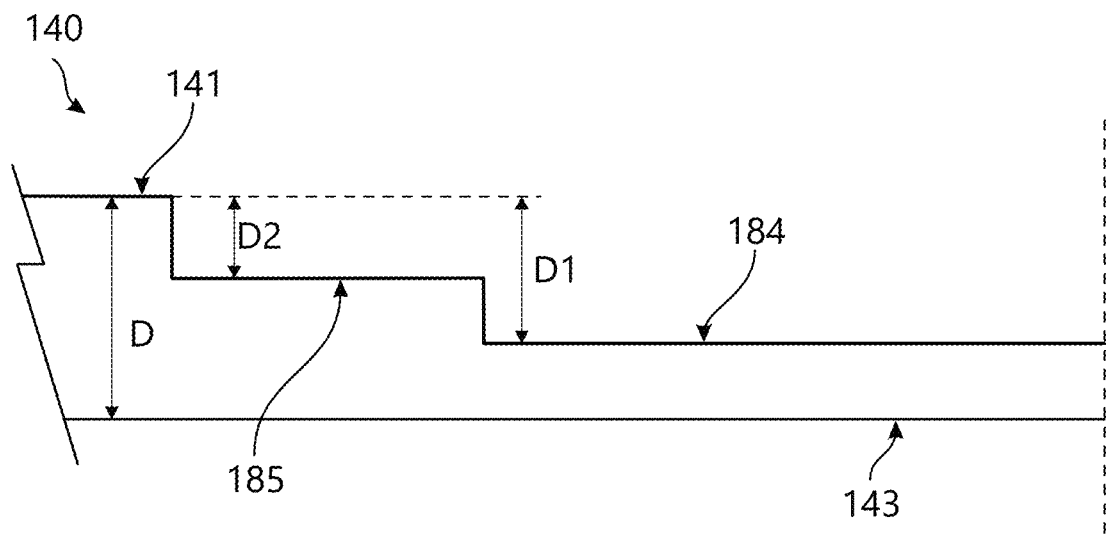
FIG. 4 shows a partial cross-sectional view of a susceptor in accordance with one or more embodiment of the disclosure.

A susceptor 140 is positioned beneath the gas distribution assembly 120. The susceptor 140 includes a top surface 141 and one or more angularly spaced (relative to a center of the susceptor) pockets 142 in the top surface 141. The one or more angularly spaced pockets 142 are positioned around a center axis 144 of the susceptor 140. The susceptor 140 also has a bottom surface 143 and an edge 144. The top surface 141 and the bottom surface 143 define a thickness D of the susceptor 140 (as shown in FIG. 4). The one or more angularly spaced pockets 142 can be any suitable shape and size depending on the shape and size of the substrates 60 being processed. In the embodiment shown in FIG. 1, the one or more angularly spaced pockets 142 have a flat bottom to support the bottom of the substrate; however, the bottom of the recess can vary. In some embodiments, the recess has step regions around the outer peripheral edge of the recess which are sized to support the outer peripheral edge of the substrate. The amount of the outer peripheral edge of the substrate that is supported by the steps can vary depending on, for example, the thickness of the substrate and the presence of features already present on the back side of the substrate. While the Figures and discussion are based on a batch processing chamber, the skilled artisan will recognize that the substrate support can be a single wafer support like those found in a single wafer processing chamber. In some embodiments, the processing chamber is a single wafer processing chamber and the pocket is centrally located with respect to the rotational axis of the substrate support.

In some embodiments, as shown in FIG. 1, the one or more angularly spaced pockets 142 in the top surface 141 of the susceptor 140 is sized so that a substrate 60 supported in the one or more angularly spaced pockets 142 has a top surface 61 substantially coplanar with the top surface 141 of the susceptor 140. As used in this specification and the appended claims, the term "substantially coplanar" means that the top surface of the substrate and the top surface of the susceptor are coplanar within ±0.2 mm. In some embodiments, the top surfaces are coplanar within ±0.15 mm, ±0.10 mm or ±0.05 mm. The susceptor 140 of FIG. 1 includes a support post 160 which is capable of lifting, lowering and rotating the susceptor 140. The susceptor may include a heater, or gas lines, or electrical components within the center of the support post 160. The support post 160 may be the primary means of increasing or decreasing the gap between the susceptor 140 and the gas distribution assembly 120, moving the susceptor 140 into proper position. The susceptor 140 may also include fine tuning actuators 162 which can make micro-adjustments to susceptor 140 to create a predetermined gap 170 between the susceptor 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor 140 can hold a plurality of substrates 60. As shown in FIG. 2, the gas distribution assembly 120 may include a plurality of separate injector units 122, each injector unit 122 being capable of depositing a film on the substrate, as the substrate is moved beneath the injector unit. Two pie-shaped injector units 122 are shown positioned on approximately opposite sides of and above the susceptor 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor 140. In some embodiments, each of the individual pie-shaped injector units 122 may be independently moved, removed and/or replaced without affecting any of the other injector units 122. For example, one segment may be raised to permit a robot to access the region between the susceptor 140 and gas distribution assembly 120 to load/unload substrates 60.

Figure 3:
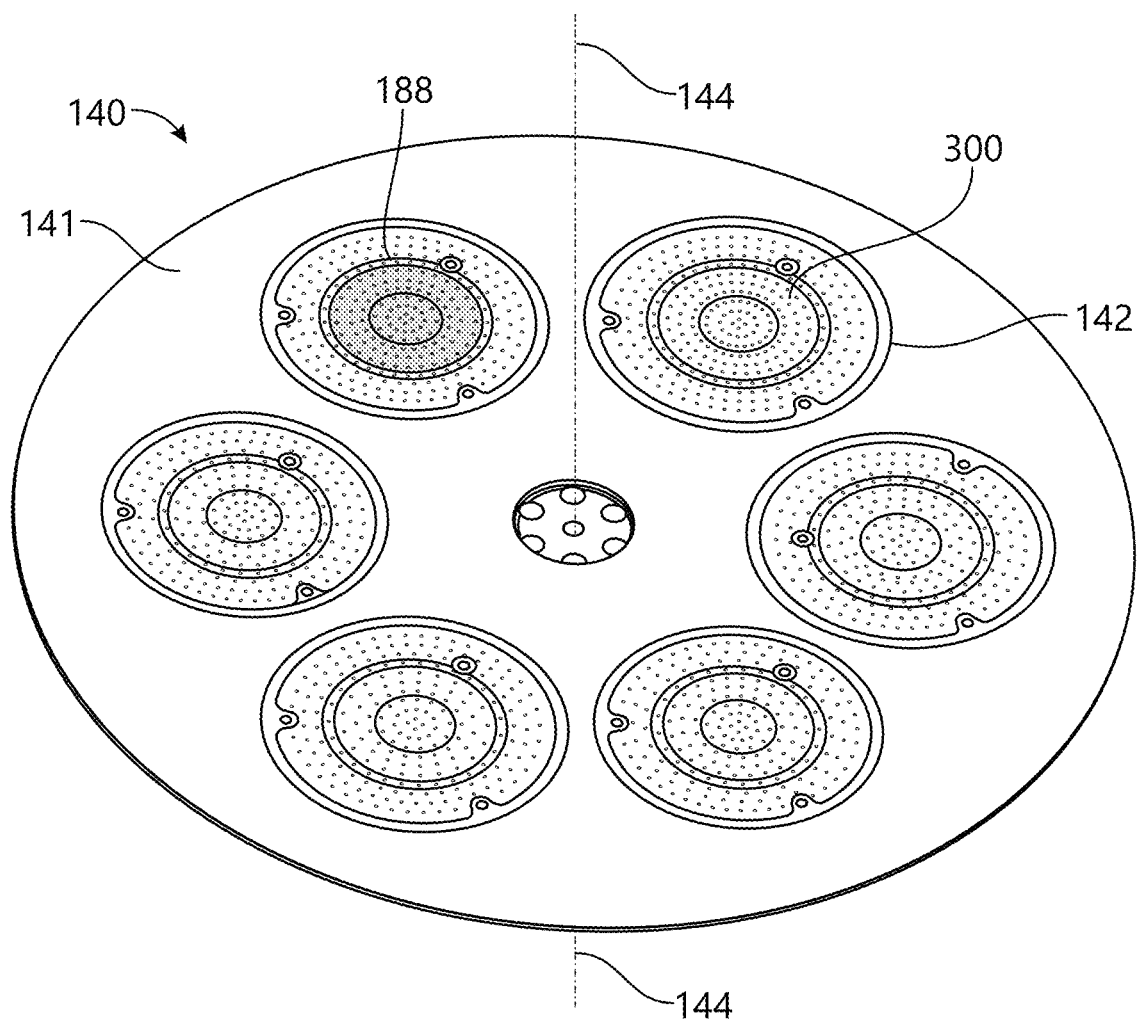
FIG. 3 shows an isometric view of a susceptor in accordance with one or more embodiment of the disclosure.
Figure 5:
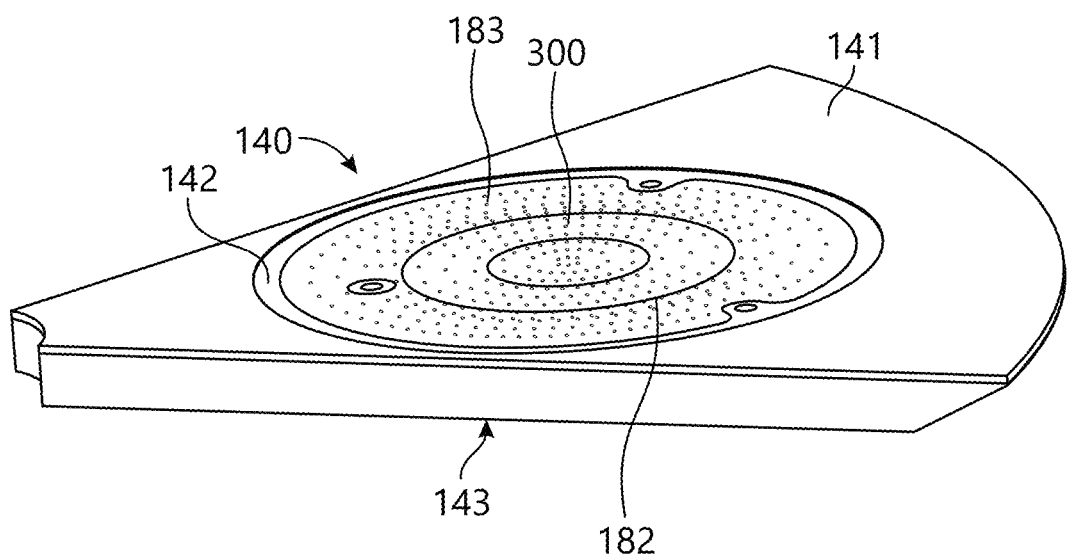
FIG. 5 shows a isometric view of a section of a susceptor in accordance with one or more embodiment of the disclosure.

In some embodiments, as shown in FIGS. 3 through 5, the one or more angularly spaced pockets 142 formed in the top surface 141 of the susceptor 140 has an inner pocket 182 and an outer pocket 183. The inner pocket 182 has an inner pocket top surface 184 at an inner pocket depth D1 from the top surface 141 of the susceptor 140 and the outer pocket 183 has an outer pocket top surface 185 at an outer pocket depth D2 from the top surface 141 of the susceptor 140. The inner pocket depth D1 being greater than the outer pocket depth D2.

In some embodiments, one or more pucks 300 are positioned within one of the pockets 142. As shown in FIG. 5, the one or more pucks 300 is positioned within the inner pocket 182. The embodiment illustrated in FIG. 3, shows one of the pucks 300 shaded.

In some embodiments, the susceptor 140 further comprises an edge sealing band 188 positioned around an edge of the inner pocket 182. In some embodiments, the edge sealing band 188 seals the edge of a wafer when a bow in the wafer is removed due to vacuum chucking. The edge sealing band 188 of some embodiments maintains the vacuum under the wafer and prevents gas from flowing in the region behind the wafer.

Figure 6:
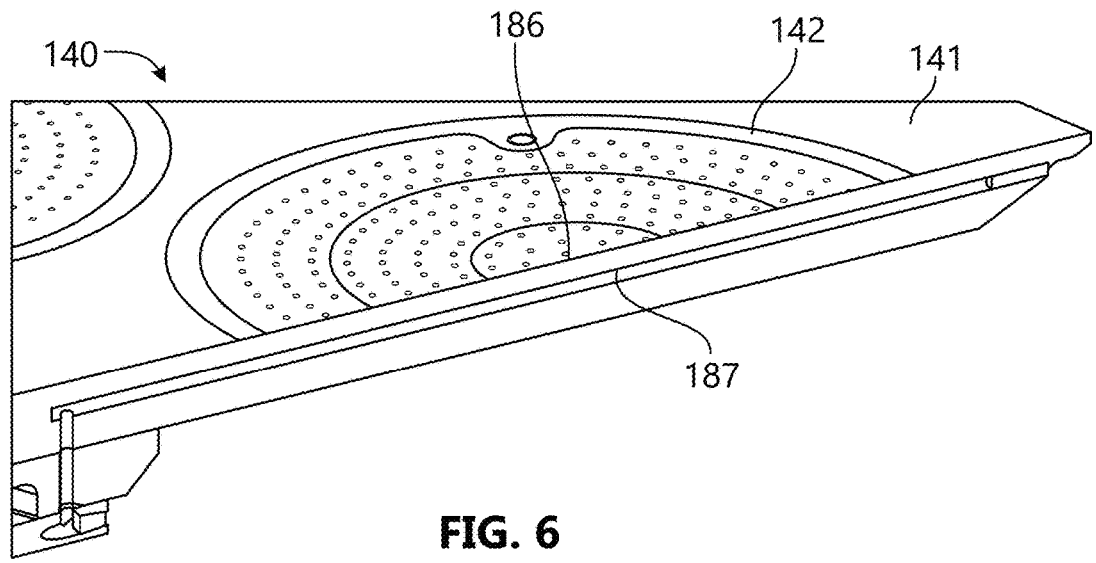
FIG. 6 shows a partial cross-sectional view of a susceptor in accordance with one or more embodiment of the disclosure.

As shown in FIG. 6, the one or more angularly spaced pockets 142 further comprise a susceptor chuck hole 186 configured to vacuum chuck a substrate 60 (of FIG. 1). The susceptor chuck hole 186 is in fluid communication with a vacuum channel 187 through which suction is created for vacuum chucking the substrate. In some embodiments, the vacuum channel 187 extends to the support post 160 (of FIG. 2) within the thickness of the susceptor 140.

As shown in FIGS. 7 through 11, the susceptor 140 is configured as an intermediate wafer chuck having one or more pucks 300 positioned within the inner pocket 182. In such a configuration, a substrate 60 (of FIG. 1) is positioned within the outer pocket 183.

The one or more pucks 300 have a body 302 with an outer peripheral edge 304, a top surface 306 and a bottom surface 308 defining a thickness T. The bottom surface 308 of the one or more pucks 300 have a center hole 310 extending a distance into the body 302 with at least one radial channel 312. The susceptor chuck hole 186 of the one or more pockets 142 is configured to vacuum chuck a substrate (of FIG. 1) through the center hole 310 of the one or more pucks 300. The one or more pucks 300 and the inner pocket 182 of the susceptor 140 have a gap of 0.5-1.5 mm to which the at least one radial channel 312 lead to. This gap serves as the slit for the chuck.

Figure 10:
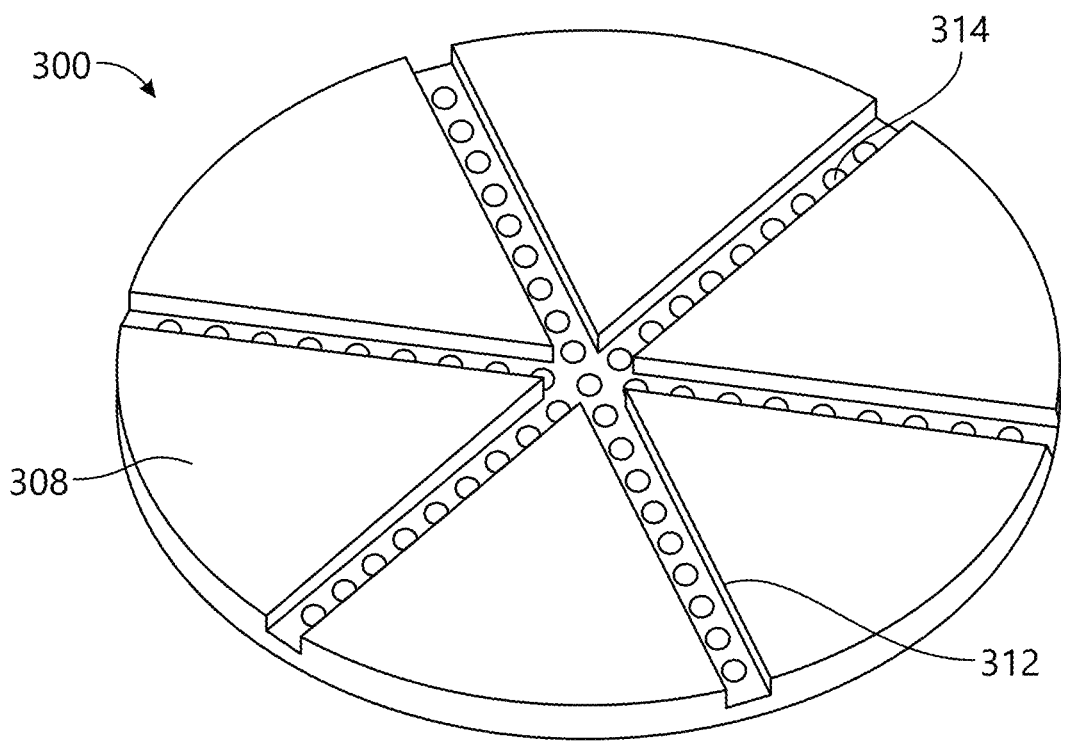
FIG. 10 shows a bottom isometric view of a puck in accordance with one or more embodiment of the disclosure.
Figure 11:
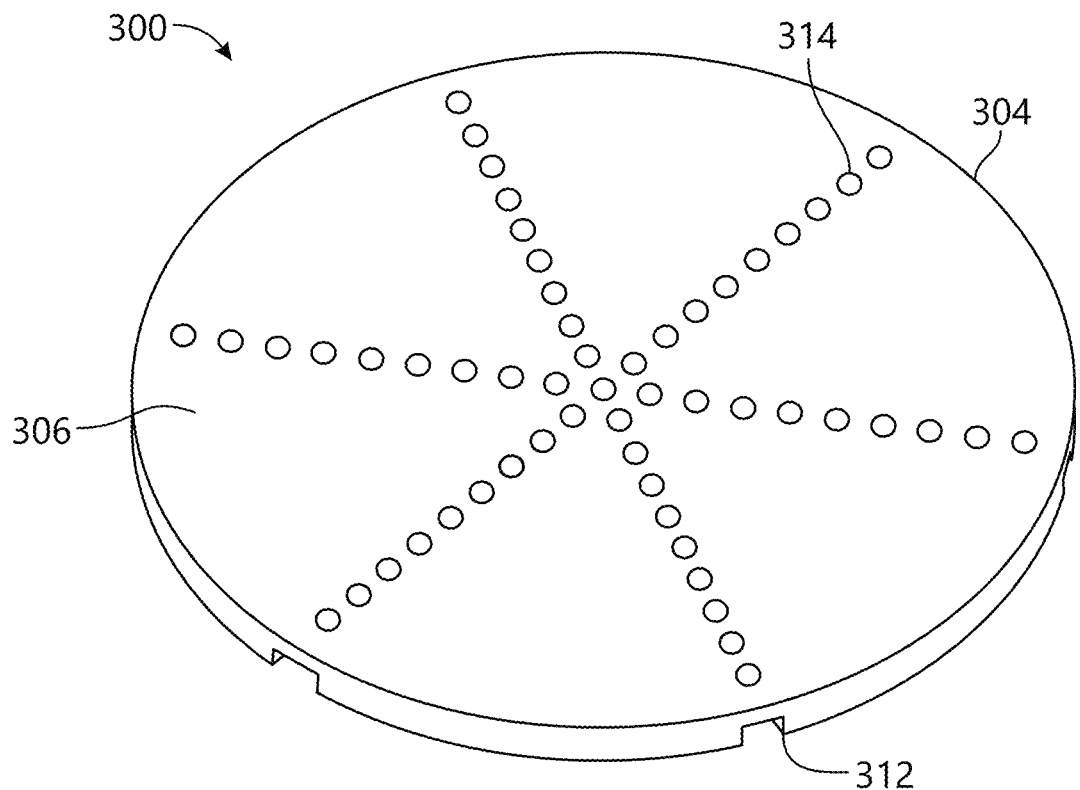
FIG. 11 shows a top isometric view of a puck in accordance with one or more embodiment of the disclosure.

FIG. 10 shows a bottom view of the one or more pucks 300 and FIG. 11 shows a top view a top view of the one or more pucks 300. The at least one radial channel 312 extends from the center hole 310 to the outer peripheral edge 304 of the body 302. Each of the at least one radial channel 312 includes a plurality of radial chuck holes 314 extending from a bottom surface 313 of the at least one channel 312 through the thickness T of the body 302 to the top surface 306 of the body 302. In some embodiments, a vacuum suction slit 316 is formed around the outer peripheral edge 304 of the one or more pucks 300 and the inner pocket 182 of the susceptor.

Figure 12:
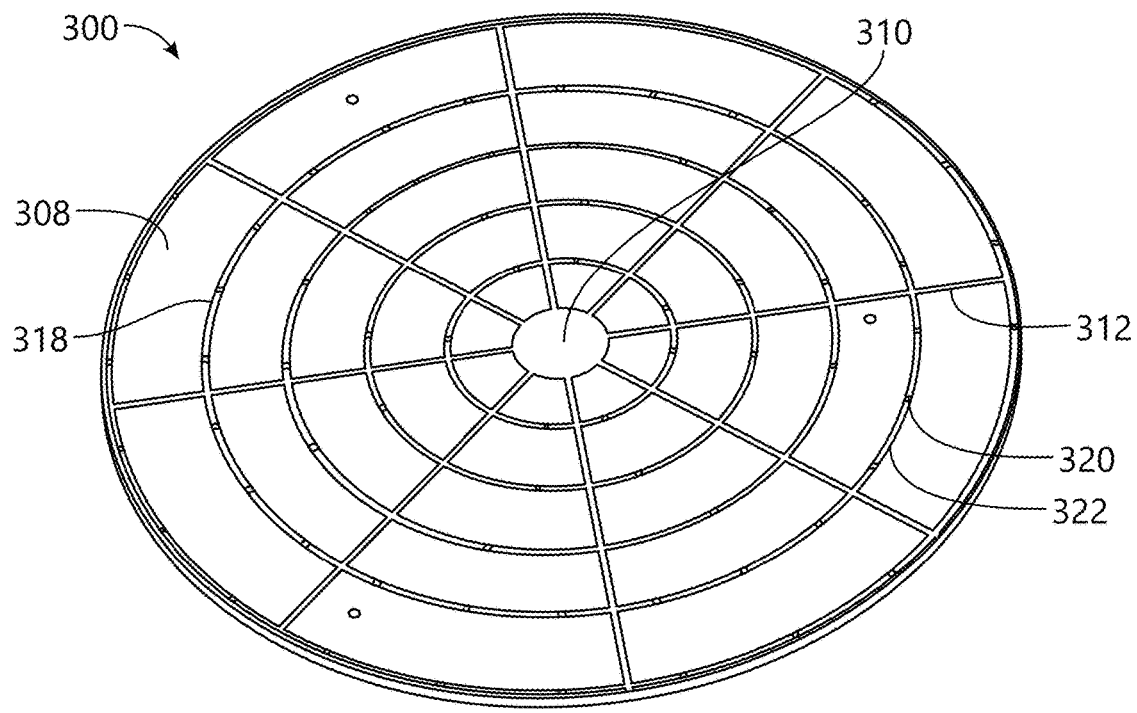
FIG. 12 shows a bottom isometric view of a puck in accordance with one or more embodiment of the disclosure.

As shown in FIG. 12, in some embodiments, the one or more pucks 300 further comprise at least one circular channel 318 formed in the bottom surface 308 of the one or more pucks 300, the at least one circular channel 318 is spaced a distance from and concentric to the center hole 310 of the one or more pucks 300. The at least one circular channel 318 is in communication with the at least one radial channel 312 and comprises a plurality of chuck holes 320 extending from a bottom surface 322 of the at least one circular channel 318 to the top surface 306 of the one or more pucks 300. In some embodiments, there are in the range of 2 to 12 spaced circular channels 318 formed in the bottom surface 322 of the puck, each of the circular channels 318 spaced at different distances from and concentric to the center hole 310 of the one or more pucks 300. In some embodiments, the bottom surface 308 of the one or more pucks 300 has six angularly spaced radial channels 312 extending from the center hole 310 of the one or more pucks 300.

Figure 13:
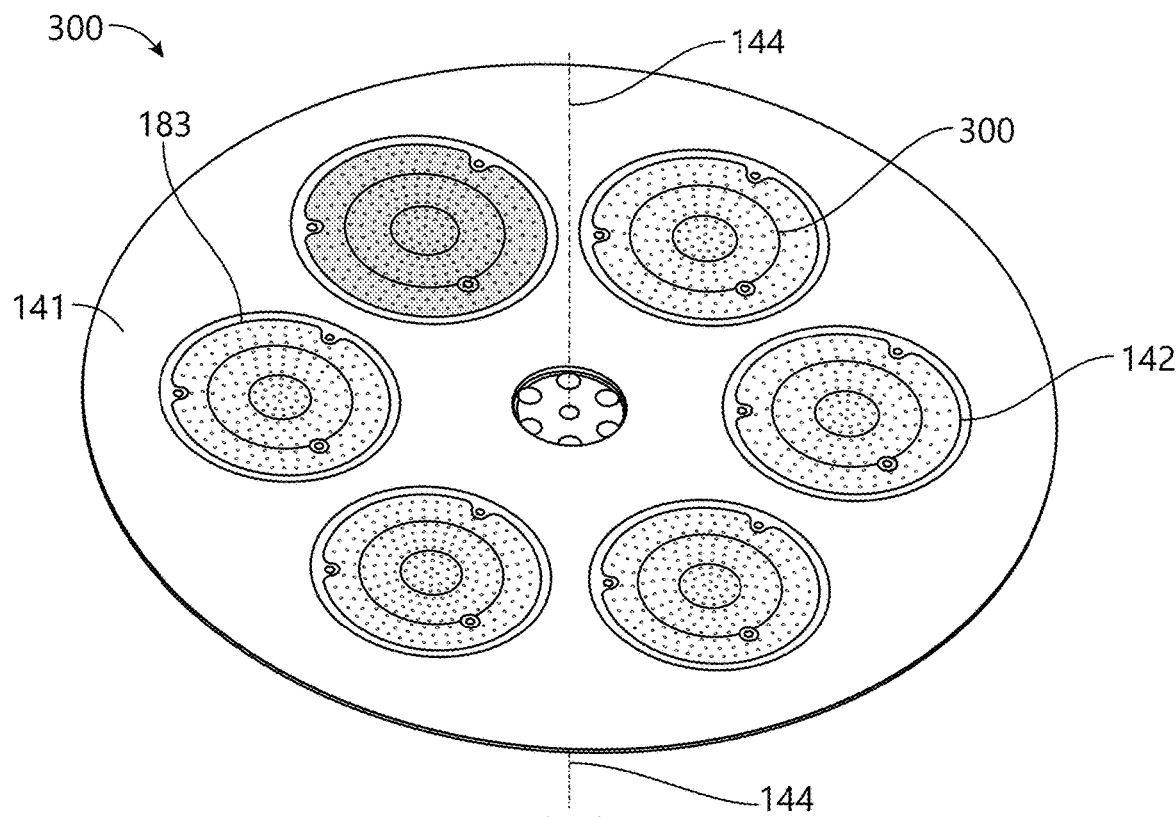
FIG. 13 shows a isometric view of a susceptor in accordance with one or more embodiment of the disclosure.
Figure 14:
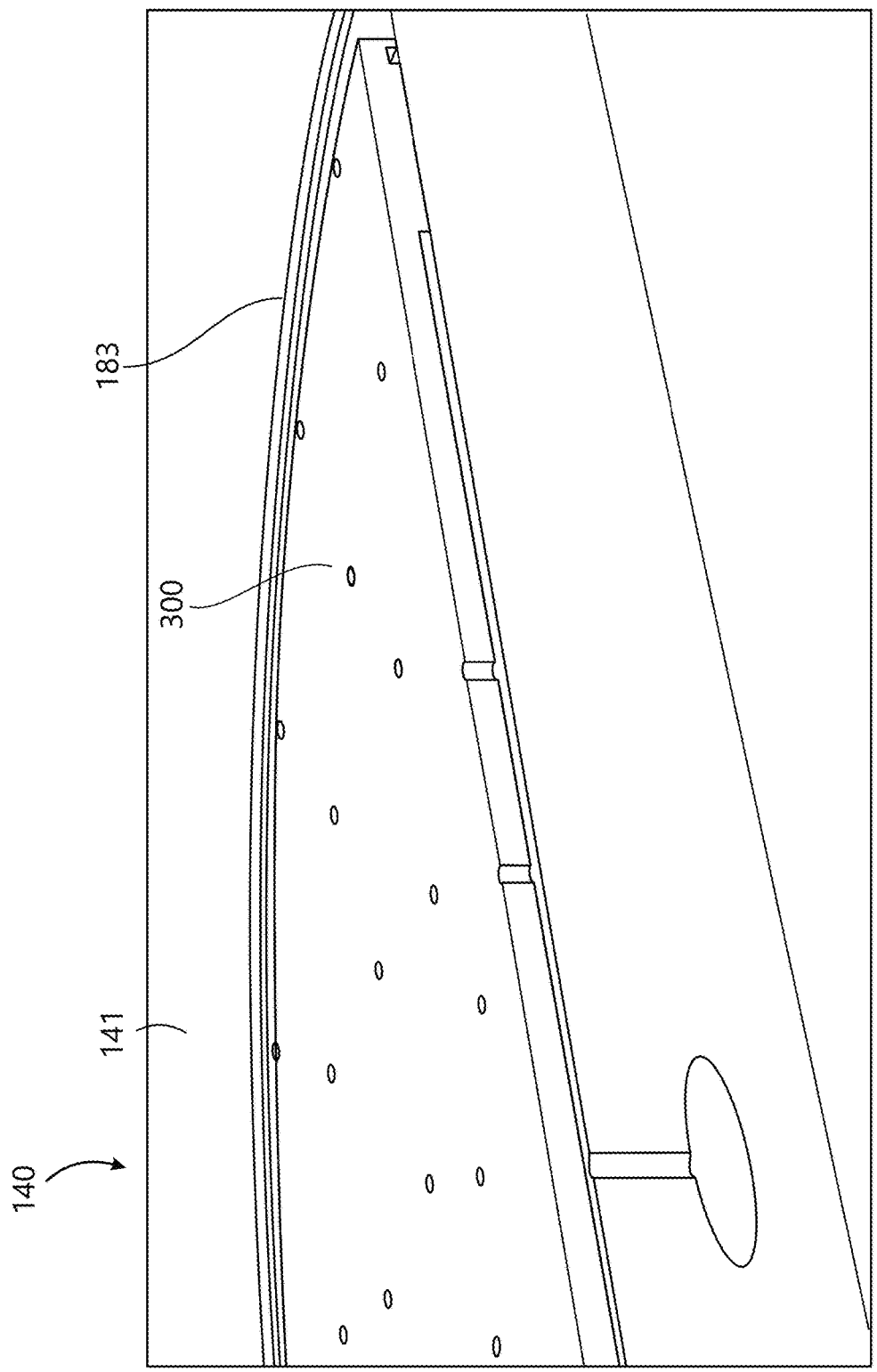
FIG. 14 shows a partial cross-sectional view of a susceptor in accordance with one or more embodiment of the disclosure.

As shown in FIGS. 13 and 14, the susceptor 140 is configured as a distributed wafer chuck having one or more pucks 300 positioned within the outer pocket depth D2. In such a configuration, a substrate 60 (of FIG. 1) is positioned over the one or more pucks 300. In some embodiments, the susceptor 140 further comprises an edge sealing band 189 positioned around an edge of the outer pocket 183. The embodiment illustrated in FIG. 13 shows one of the pucks 300 shaded to illustrated the differences, with respect to FIG. 3, of the inner pocket pucks and the outer pocket pucks. The illustrated embodiments are merely for descriptive purposes and should not be taken as limiting the scope of the disclosure to any particular sizes or ratios of the pockets.

With reference to the previously described embodiments, the intermediate and distributed wafer chucks are configured to account for bowing of substrates due to vacuum applied through the susceptor chuck hole 186 when vacuum chucking a substrate. Conventional substrate supports are not able to flatten a warped or bowed wafer by much. For example, a conventional substrate support with a center chuck has one hole in the middle of the pocket and is limited to flattening a wafer with a bow up to about 100 to 150 microns. In some embodiments, the susceptor or single wafer substrate support is configured to flatten wafers that are bowed up to 500, 600, 700, 800, 900 or 1000 micron. As used in this manner, a wafer has been "flattened" when there is substantially no leakage around the wafer to the back side. In some embodiments, the degree of wafer chucking is measured based on the degree of surface contact with the susceptor and/or measurement of the heat transfer between the wafer and susceptor, which will be at maximum for a fully flattened wafer. One or more embodiments of the disclosure advantageously provide substrate supports which allow for chucking at multiple radii from a single centered chuck hole.

Figure 7:
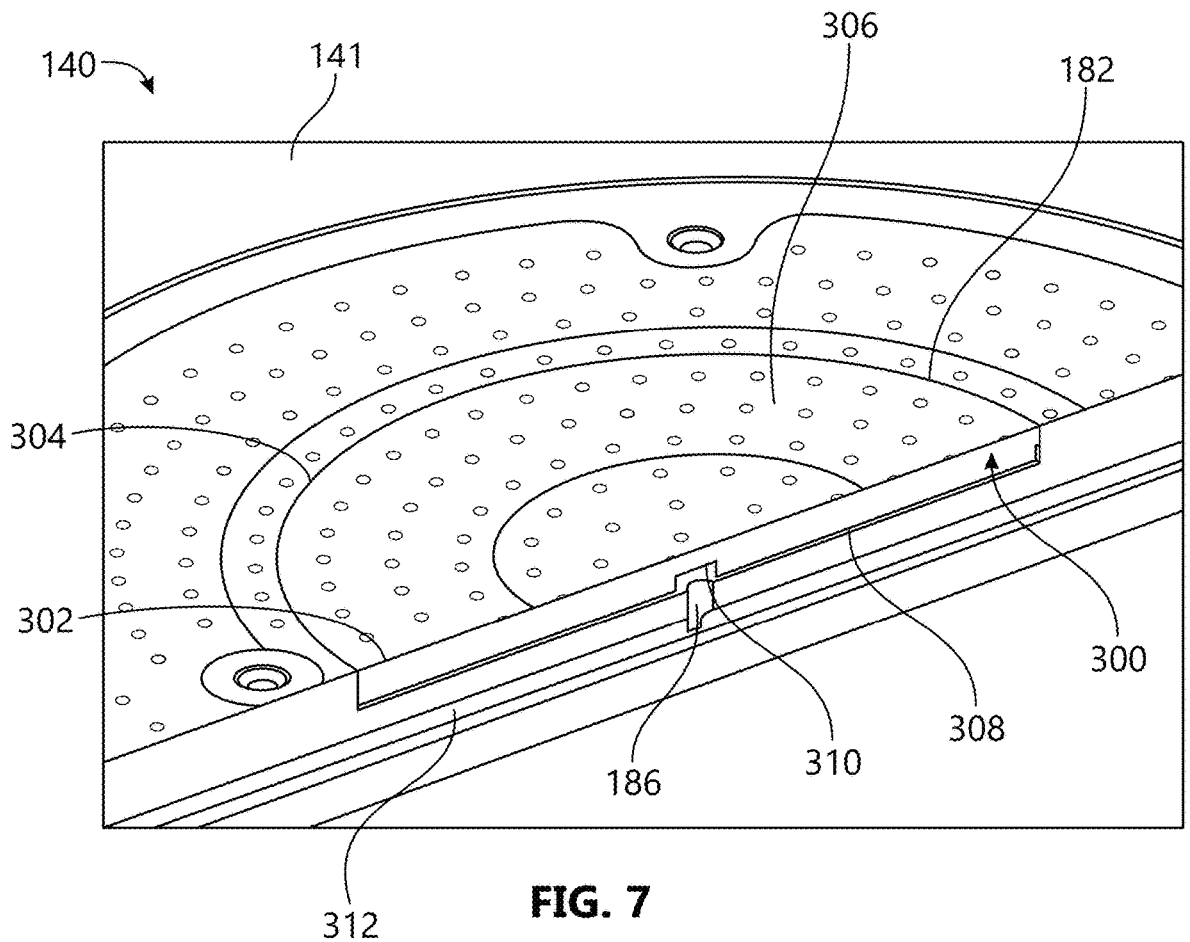
FIG. 7 shows a partial cross-sectional view of a susceptor in accordance with one or more embodiment of the disclosure.
Figure 8:
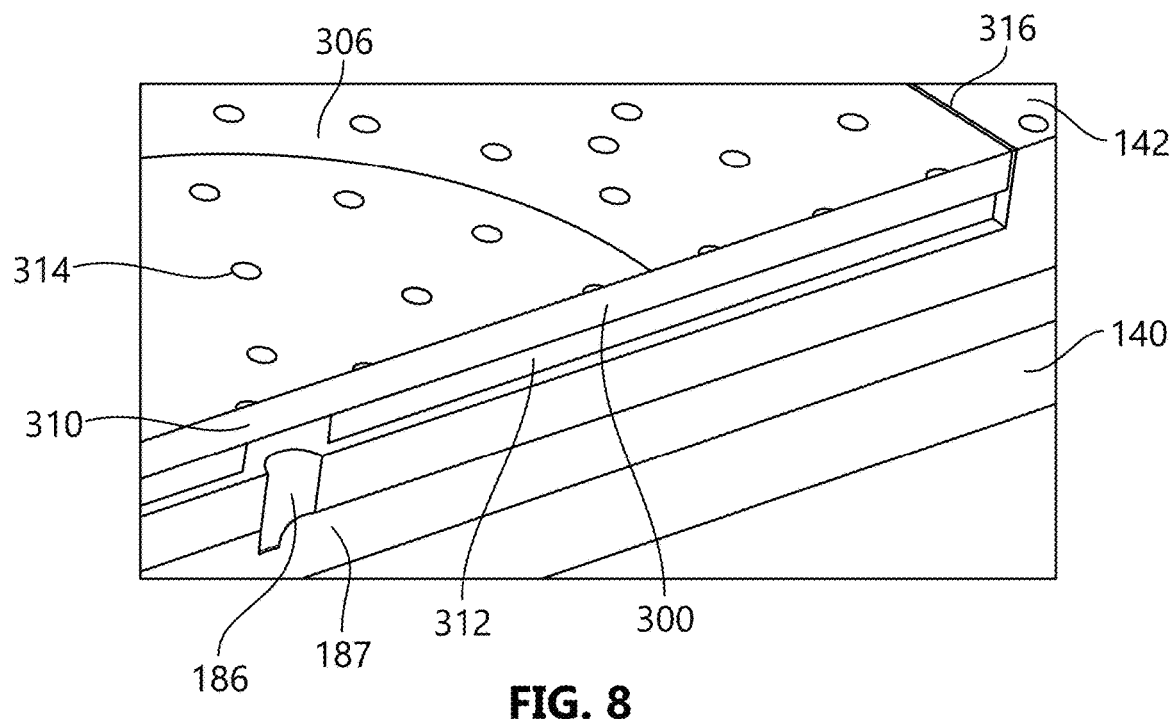
FIG. 8 shows a partial cross-sectional view of a susceptor in accordance with one or more embodiment of the disclosure.
Figure 9:
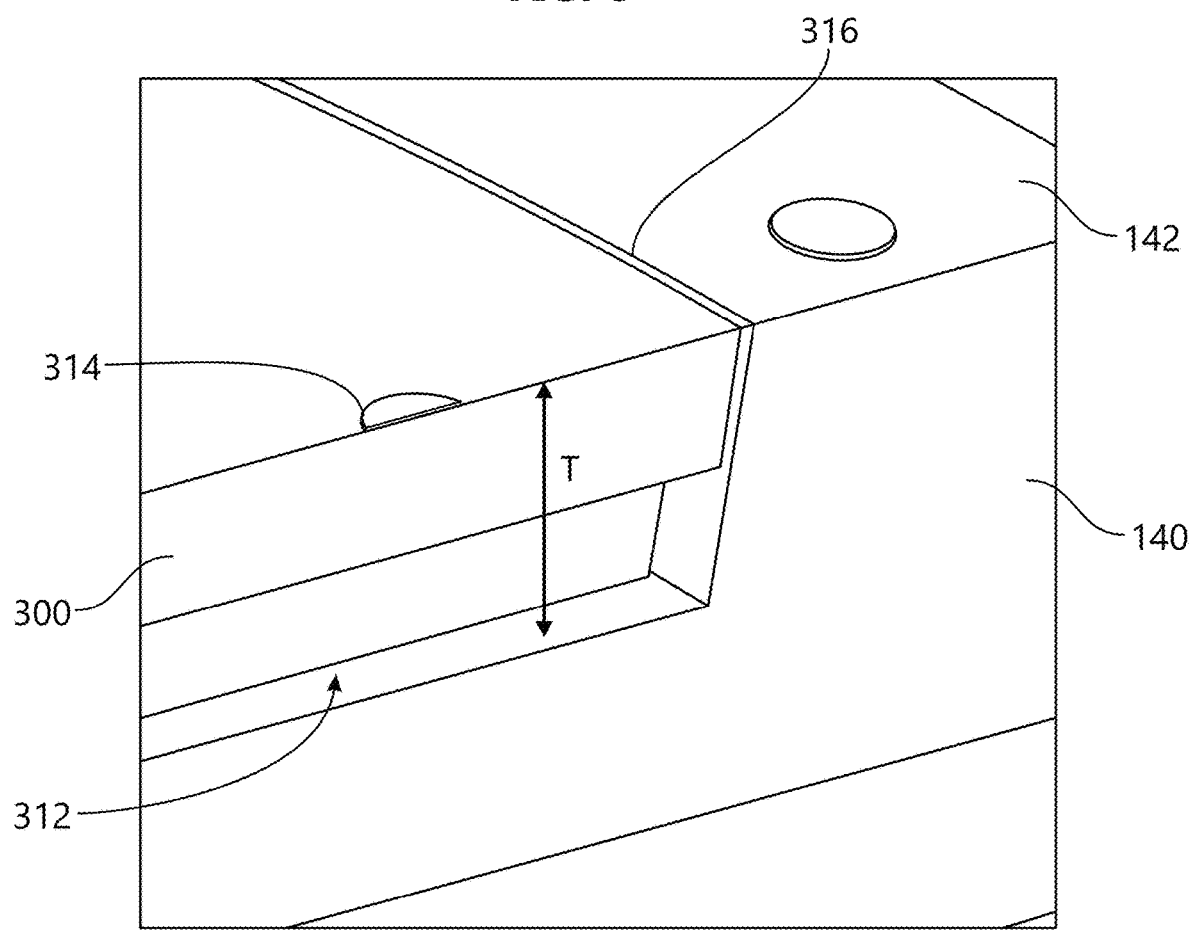
FIG. 9 shows a partial cross-sectional view of a susceptor in accordance with one or more embodiment of the disclosure.

In some embodiments of the intermediate wafer chuck of FIGS. 3 through 9, the top surface 306 of the one or more pucks 300 is substantially coplanar with the outer pocket top surface 185. As shown in FIG. 7, the substrate (not shown) is placed within the outer pocket 183 and over the coplanar top surface 306 of the one or more pucks 300 and the outer pocket top surface 185. In some embodiments, the top surface 306 of the one or more pucks 300 is at a greater depth from the top surface 141 of the susceptor 140 than the outer pocket top surface 185. In some embodiments, the top surface 306 of the one or more pucks 300 is a smaller depth from the top surface 141 of the susceptors 140 than the outer pocket top surface 184.

Figure 15:
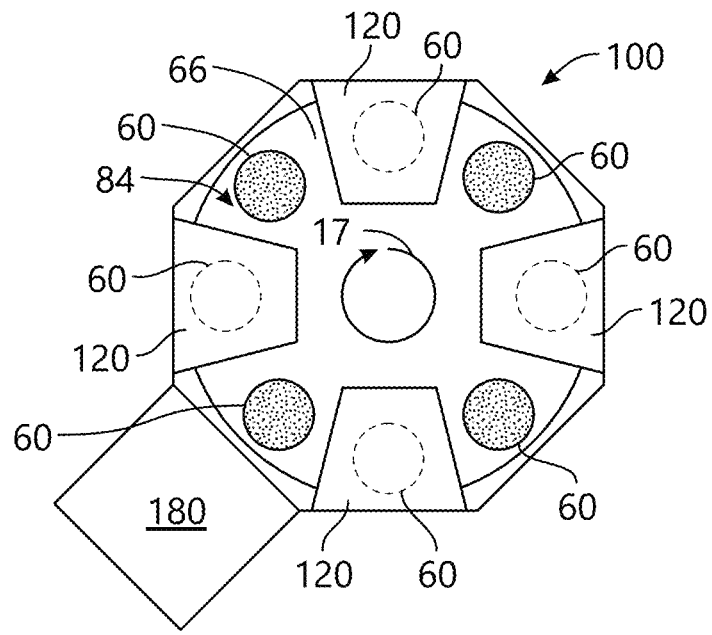
FIG. 15 shows a schematic view of a batch processing chamber in accordance with one or more embodiment of the disclosure.

Processing chambers having multiple gas injectors can be used to process multiple substrates simultaneously so that the substrates experience the same process flow. For example, as shown in FIG. 15, the processing chamber 100 has four gas injector assemblies and four substrates 60. At the outset of processing, the substrates 60 can be positioned between the injector assemblies 30. Rotating 17 the susceptor 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. The number of substrates 60 and gas distribution assemblies 120 can be the same or different. In some embodiments, there are the same numbers of substrates being processed as there are gas distribution assemblies. In one or more embodiments, the number of substrates being processed are fraction of or an integer multiple of the number of gas distribution assemblies. For example, if there are four gas distribution assemblies, there are 4× substrates being processed, where x is an integer value greater than or equal to one. In an exemplary embodiment, the gas distribution assembly 120 includes eight processing regions separated by gas curtains and the susceptor 140 can hold six substrates.

The processing chamber 100 shown in FIG. 15 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A substrate robot may be positioned in the chamber 180 to move the substrate onto the susceptor.

Rotation of the carousel (e.g., the susceptor 140) can be continuous or intermittent (discontinuous). In continuous processing, the substrates are constantly rotating so that they are exposed to each of the injectors in turn. In discontinuous processing, the substrates can be moved to the injector region and stopped, and then to the region 84 between the injectors and stopped. For example, the carousel can rotate so that the substrates move from an inter-injector region across the injector (or stop adjacent the injector) and on to the next inter-injector region where the carousel can pause again. Pausing between the injectors may provide time for additional processing between each layer deposition (e.g., exposure to plasma).

Figure 16:
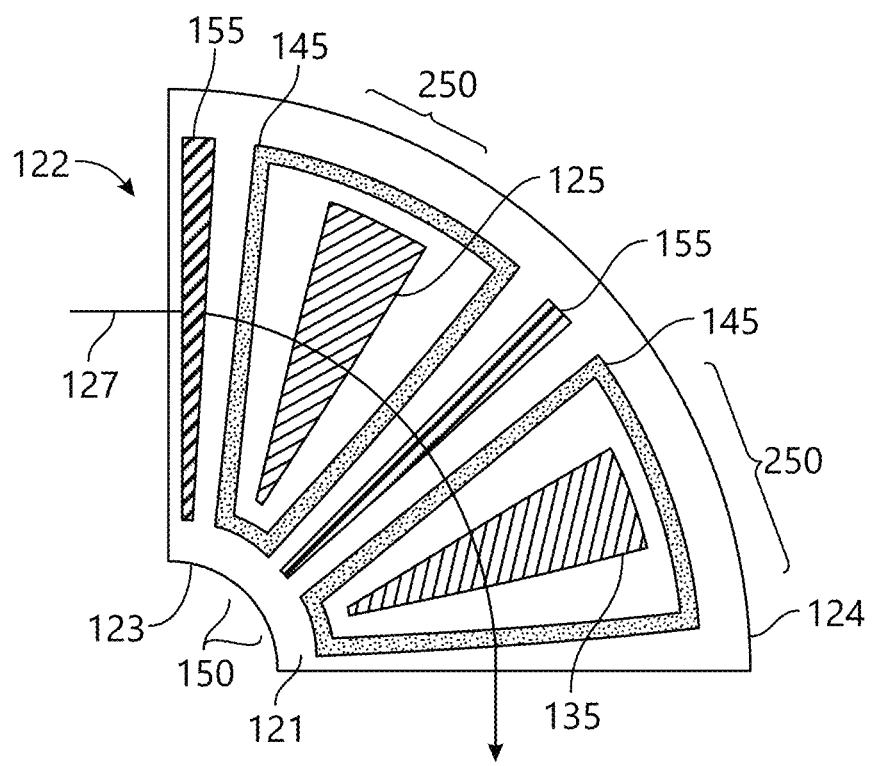
FIG. 16 shows a schematic view of a portion of a wedge shaped gas distribution assembly for use in a batch processing chamber in accordance with one or more embodiment of the disclosure.
Figure 17:
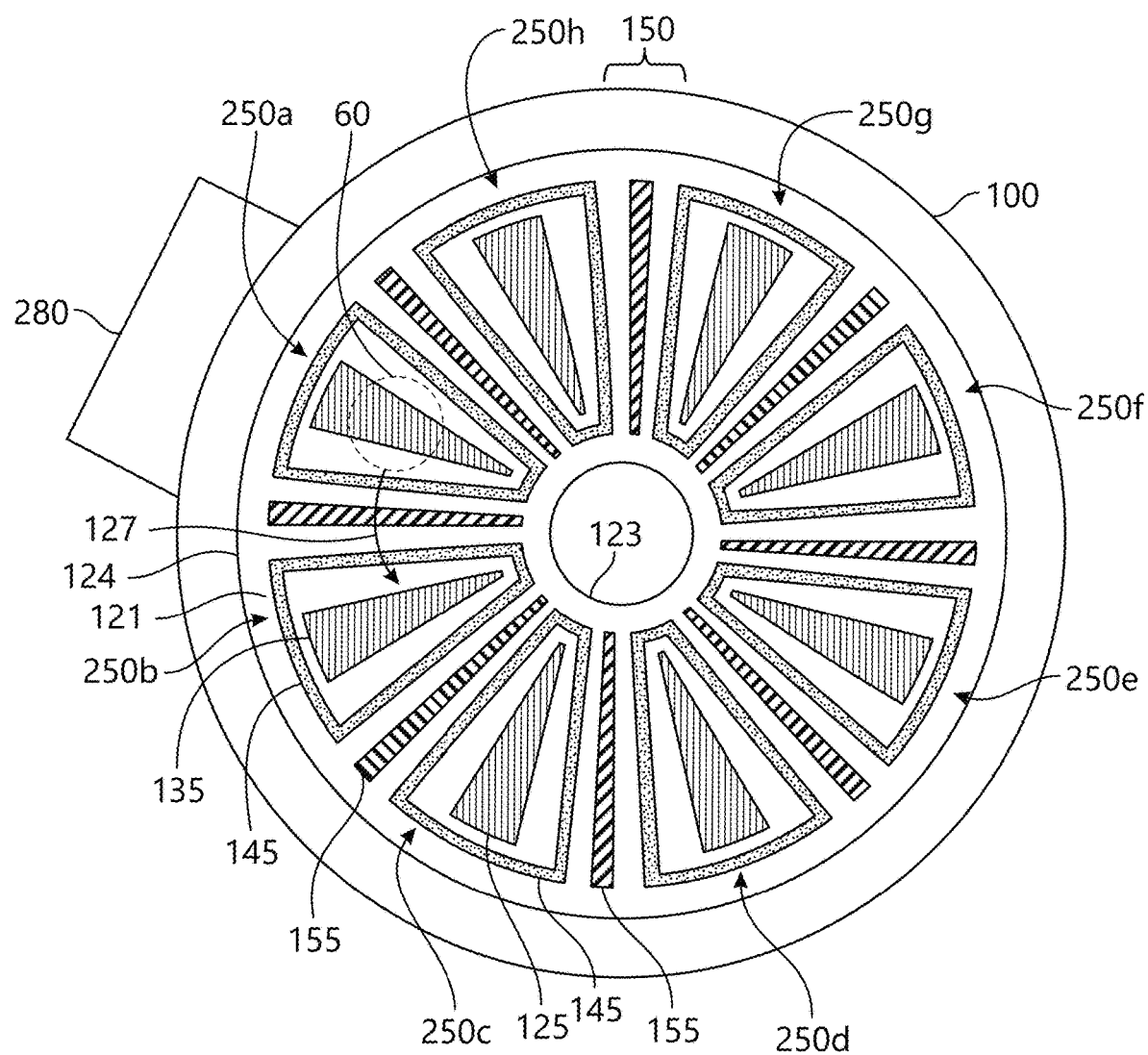
FIG. 17 shows a schematic view of a batch processing chamber in accordance with one or more embodiments of the disclosure.

FIG. 16 shows a sector or portion of a gas distribution assembly 220, which may be referred to as an injector unit 122. The injector units 122 can be used individually or in combination with other injector units. For example, as shown in FIG. 17, four of the injector units 122 of FIG. 16 are combined to form a single gas distribution assembly 220. (The lines separating the four injector units are not shown for clarity.) While the injector unit 122 of FIG. 16 has both a first reactive gas port 125 and a second gas port 135 in addition to purge gas ports 155 and vacuum ports 145, an injector unit 122 does not need all of these components.

Referring to both FIGS. 16 and 17, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 155 and elongate vacuum ports 145 in a front surface 121 of the gas distribution assembly 220. The plurality of elongate gas ports 125, 135, 155 and elongate vacuum ports 145 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 16 or 17, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 16 and 17, the wedge shaped reactive gas ports 125, 135 are surrounded on all edges, including adjacent the inner peripheral region and outer peripheral region, by a vacuum port 145.

Referring to FIG. 16, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 16, the substrate has been exposed to the first gas port 125 and the second gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 16 shows a gas curtain 150 that separates the reactive gases. The term "gas curtain" is used to describe any combination of gas flows or vacuum that separate reactive gases from mixing. The gas curtain 150 shown in FIG. 16 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 17, the combination of gas flows and vacuum from the gas distribution assembly 220 form a separation into a plurality of processing regions 250. The processing regions are roughly defined around the individual gas ports 125, 135 with the gas curtain 150 between 250. The embodiment shown in FIG. 17 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor to be held near the front surface 121 of the gas distribution assembly 120. The substrate 60 is loaded via the factory interface 280 into the processing chamber 100 onto a substrate support or susceptor (see FIG. 15). The substrate 60 can be shown positioned within a processing region because the substrate is located adjacent the first reactive gas port 125 and between two gas curtains 150*a*, 150*b*. Rotating the substrate 60 along path 127 will move the substrate counter-clockwise around the processing chamber 100. Thus, the substrate 60 will be exposed to the first processing region 250*a* through the eighth processing region 250*h*, including all processing regions between.

Embodiments of the disclosure are directed to processing methods comprising a processing chamber 100 with a plurality of processing regions 250*a*-250*h* with each processing region separated from an adjacent region by a gas curtain 150. For example, the processing chamber shown in FIG. 17. The number of gas curtains and processing regions within the processing chamber can be any suitable number depending on the arrangement of gas flows. The embodiment shown in FIG. 17 has eight gas curtains 150 and eight processing regions 250*a*-250*h*. The number of gas curtains is generally equal to or greater than the number of processing regions. In some embodiments, the number of processing regions is greater than the number of gas curtains and one or more of the gases present in the processing regions not separated by a gas curtain are combined.

A plurality of substrates 60 are positioned on a substrate support, for example, the susceptor 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example, if the first reactive gas is flowing into processing regions 250*b* through processing region 250*h*, an inert gas would be flowing into processing region 250*a*. The inert gas can be flowed through the first reactive gas port 125 or the second gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

Accordingly, one or more embodiments of the disclosure are directed to processing methods utilizing a batch processing chamber like that shown in FIG. 17. A substrate 60 is placed into the processing chamber which has a plurality of sections 250, each section separated from adjacent section by a gas curtain 150. At least a portion of the substrate surface is exposed to a first process condition in a first section 250a of the processing chamber.

The substrate surface is laterally moved through a gas curtain 150 to a second section 250b of the processing chamber. The substrate surface is exposed to a second process condition in the second section 250b.

The substrate surface is laterally moved through a gas curtain 150 to a third section 250c of the processing chamber. The substrate surface can then be exposed to a third process condition in the third section 250c. In some embodiments, the third section 250c contains the same process condition as one or more of the first section 250a or the second section 250b.

The substrate surface is laterally moved through a gas curtain 150 to a fourth section 250d of the processing chamber. The substrate surface can then be exposed to a fourth process condition in the fourth section 250d. In some embodiments, the fourth section 250d contains the same process condition as one or more of the first section 250a, the second section 250b or the third section 250c.

Some embodiments of the disclosure are directed to processing methods comprising moving a substrate between a first processing region without a plasma and a second processing region with a plasma. The first processing region is also referred to as a non-plasma processing region. The second processing region is also referred to as a plasma processing region. The substrate has a breakdown voltage. The skilled artisan will recognize that the substrate refers to any part of the substrate or device (e.g., transistor) being formed on the substrate.

The substrate of some embodiments is larger than the processing region so that not all of the substrate can fit within the processing region at any given time. During movement of the substrate between the plasma processing region and the non-plasma processing region parts of the substrate are exposed to the plasma and parts of the substrate are not exposed to plasma. This non-uniform plasma exposure results in charge buildup or a voltage (potential) differential on the substrate.

As shown in FIG. 1, a controller 395 may be provided and coupled to various components of the processing chamber 100 to control the operation thereof. The controller 195 can be a single controller that controls the entire processing chamber 100, or multiple controllers that control individual portions of the processing chamber 100. In some embodiments, the controller 195 includes a central processing unit (CPU) 196, support circuits 197, memory 198, and an input/output (I/O) 199. The controller 195 may control the processing chamber 100 directly, or via computers (or controllers) associated with particular process chamber and/ or support system components. The controller 195 may be one of any form of general-purpose computer processor that can be used in an industrial setting for controlling various chambers and sub-processors. The memory 198 or computer readable medium of the controller 195 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 197 are coupled to the CPU 196 for supporting the processor in a conventional manner. These circuits include cache, power supplies, clock circuits, input/output circuitry and subsystems, and the like. One or more processes may be stored in the memory 198 as software routine that may be executed or invoked to control the operation of the processing chamber 100 or individual processing chambers in the manner described herein. The software routine may also be stored and/or executed by a second CPU (not shown) that is remotely located from the hardware being controlled by the CPU 196. The input/output 199 can include keyboards, computer mice, displays and/or printers.

In some embodiments, a controller is coupled to the susceptor and the gas distribution assembly. The controller has one or more configurations to control the various functions and processes. In some embodiments, the configurations are selected from a first configuration to vacuum chuck a substrate, a second configuration to rotate the susceptor about the central axis, a third configuration to provide a flow of gas into the non-plasma processing region, a fourth configuration to provide a flow of gas into the plasma processing region, a fifth configuration to provide power to the plasma processing region to ignite a plasma and/or a fifth configuration to pulse the power to the plasma processing region to generate an ON time and an OFF time for the plasma processing region.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A susceptor assembly comprising:
a susceptor having a top surface and a bottom surface and a center axis, the top surface and bottom surface defining a thickness of the susceptor;
one or more angularly spaced pockets formed in the top surface of the susceptor, each of the angularly spaced pockets having an inner pocket and an outer pocket, the inner pocket having an inner pocket top surface at an inner pocket depth from the top surface of the susceptor and the outer pocket having an outer pocket top surface at an outer pocket depth from the top surface of the susceptor, the inner pocket depth being greater than the outer pocket depth; and,
one or more pucks having a body with an outer peripheral edge, a top surface and a bottom surface defining a thickness, each of the pucks positioned within one of the pockets, the bottom surface of one or more of the pucks having a center hole extending a distance into the body with at least one radial channel extending from the center hole to the outer peripheral edge of the body.

2. The susceptor assembly of claim 1, wherein each of the pockets further comprises a susceptor chuck hole.

3. The susceptor assembly of claim 2, wherein the susceptor chuck hole is configured to vacuum chuck a substrate through the holes.

4. The susceptor assembly of claim 1, wherein the one or more pucks is positioned within the inner pocket depth.

5. The susceptor assembly of claim 4, wherein a vacuum suction slit is formed around the outer peripheral edge of the one or more pucks and the inner pocket.

6. The susceptor assembly of claim 4, wherein the top surface of the puck is substantially coplanar with the outer pocket top surface.

7. The susceptor assembly of claim 4, wherein the top surface of the puck is at a greater depth from the top surface of the susceptor than the outer pocket top surface.

8. The susceptor assembly of claim 4, wherein the top surface of the puck is a smaller depth from the top surface of the susceptor than the outer pocket top surface.

9. The susceptor assembly of claim 1, wherein the one or more pucks is positioned within the outer pocket depth.

10. The susceptor assembly of claim 9, wherein the one or more pucks is configured as a distributed chuck.

11. The susceptor assembly of claim 10, wherein the one or more pucks further comprise at least one circular channel formed in the bottom surface of the puck, the at least one circular channel spaced a distance from and concentric to the center hole.

12. The susceptor assembly of claim 11, wherein there are in the range of 2 to 12 spaced circular channels formed in the bottom surface of the puck, each of the circular channels spaced at different distances from and concentric to the center hole.

13. The susceptor assembly of claim 11, wherein each of the at least one circular channels further comprises a plurality of chuck holes extending from a bottom surface of the circular channel to the top surface of the puck.

14. The susceptor assembly of claim 1, wherein a vacuum suction slit is formed around the outer peripheral edge of the one or more pucks and the one or more spaced pockets.

15. The susceptor assembly of claim 1, wherein the bottom surface of the one or more pucks has six angularly spaced radial channels extending from the center hole of the puck.

16. The susceptor assembly of claim 1, wherein the bottom surface of the one or more pucks has a plurality of ring-shaped channels concentrically positioned around the center of the one or more pucks, the plurality of the ring-shaped channels in fluid communication with the at least one radial channel.

17. The susceptor assembly of claim 16, wherein each of the plurality of ring-shaped channels have a plurality of radial holes extending through the thickness of the one or more pucks.

18. The susceptor assembly of claim 1, wherein each of the at least one radial channel has a plurality of radial chuck holes extending from a bottom surface of the channel through the thickness of the body to the top surface of the body.

19. A processing chamber comprising:
   a vacuum chamber having a bottom with an opening therethrough;
   a susceptor assembly comprising:
      a susceptor having a top surface and a bottom surface and a center axis, the top surface and bottom surface defining a thickness of the susceptor;
      one or more angularly spaced pockets formed in the top surface of the susceptor, each of the angularly spaced pockets having an inner pocket and an outer pocket, the inner pocket having an inner pocket top surface at an inner pocket depth from the top surface of the susceptor and the outer pocket having an outer pocket top surface at an outer pocket depth from the top surface of the susceptor, the inner pocket depth being greater than the outer pocket depth; and,
      one or more pucks having a body with an outer peripheral edge, a top surface and a bottom surface defining a thickness, each of the pucks positioned within one of the pockets, the bottom surface of one or more of the pucks having a center hole extending a distance into the body with at least one radial channel extending from the center hole to the outer peripheral edge of the body, each of the at least one radial channel having a plurality of radial chuck holes extending from a bottom surface of the channel through the thickness of the body to the top surface of the body.

20. A method for vacuum chucking a substrate onto a susceptor assembly comprising:
   positioning one or more substrates over one or more radially spaced pockets of a susceptor;
   creating a vacuum through one or more of a center chuck hole or a radial chuck holes extending through a thickness of the one or more pucks;
   wherein the susceptor has a top surface and a bottom surface and a center axis, the top surface and bottom surface defining a thickness;
   wherein the one or more radially spaced pockets having a inner pocket and an outer pocket formed in the top surface of the susceptor each of the angularly spaced pockets having an inner pocket and an outer pocket, the inner pocket having an inner pocket top surface at an inner pocket depth from the top surface of the susceptor and the outer pocket having an outer pocket top surface at an outer pocket depth from the top surface of the susceptor, the inner pocket depth being greater than the outer pocket depth; wherein one or more pucks have a body with an outer peripheral edge, a top surface and a bottom surface defining a thickness, each of the pucks positioned within one of the pockets, the bottom surface of one or more of the pucks having a center hole extending a distance into the body with at least one radial channel extending from the center hole to the outer peripheral edge of the body, each of the at least one radial channel having a plurality of radial chuck holes extending from a bottom surface of the channel through the thickness of the body to the top surface of the body.

\* \* \* \* \*